US006957158B1

(12) United States Patent
Hancock et al.

(10) Patent No.: US 6,957,158 B1
(45) Date of Patent: Oct. 18, 2005

(54) HIGH DENSITY RANDOM ACCESS MEMORY IN AN INTELLIGENT ELECTRIC DEVICE

(75) Inventors: Martin A. Hancock, Victoria (CA); Aaron J. Taylor, Brentwood Bay (CA); Simon H. Lightbody, Victoria (CA)

(73) Assignee: Power Measurement Ltd., British Colombia (CA)

(*) Notice: Subject to any disclaimer, the term of this patent is extended or adjusted under 35 U.S.C. 154(b) by 0 days.

(21) Appl. No.: 10/328,397

(22) Filed: Dec. 23, 2002

(51) Int. Cl.[7] .......................... G01R 31/36; G11C 11/42
(52) U.S. Cl. ......................... 702/61; 365/112; 365/158; 365/200; 340/870.2; 438/128; 438/289; 702/62; 702/64; 702/176; 709/224; 710/308
(58) Field of Search ...................... 702/61–64, 176; 365/112, 158, 163, 200; 324/247; 438/289, 438/128; 709/224; 359/22; 714/6; 340/870.02; 700/291; 710/308

(56) References Cited

U.S. PATENT DOCUMENTS

| | | | | |
|---|---|---|---|---|
| 4,296,464 A | * | 10/1981 | Woods et al. ................ | 710/308 |
| 4,306,293 A | * | 12/1981 | Marathe ...................... | 700/291 |
| 4,361,877 A | * | 11/1982 | Dyer et al. .................. | 702/176 |
| 4,697,182 A | * | 9/1987 | Swanson ............... | 340/870.02 |
| 4,881,070 A | * | 11/1989 | Burrowes et al. ...... | 340/870.02 |
| 5,216,623 A | * | 6/1993 | Barrett et al. ................. | 702/62 |
| 5,341,328 A | * | 8/1994 | Ovshinsky et al. ......... | 365/163 |
| 5,424,974 A | * | 6/1995 | Liu et al. ..................... | 365/112 |
| 5,440,232 A | * | 8/1995 | Scarzello et al. ............ | 324/247 |
| 5,535,399 A | * | 7/1996 | Blitz et al. ...................... | 714/6 |
| 5,627,759 A | * | 5/1997 | Bearden et al. ............... | 702/62 |
| 6,072,608 A | * | 6/2000 | Psaltis et al. .................. | 359/22 |
| 6,077,729 A | * | 6/2000 | Harshfield .................. | 438/128 |
| 6,392,924 B1 | * | 5/2002 | Liu et al. ..................... | 365/158 |
| 6,615,147 B1 | * | 9/2003 | Jonker et al. ................. | 702/61 |
| 6,625,057 B2 | * | 9/2003 | Iwata .......................... | 365/158 |
| 6,671,635 B1 | * | 12/2003 | Forth et al. ................... | 702/61 |
| 6,701,363 B1 | * | 3/2004 | Chiu et al. .................. | 709/224 |
| 6,708,126 B2 | * | 3/2004 | Culler et al. .................. | 702/64 |
| 6,730,567 B2 | * | 5/2004 | Forbes et al. ............... | 438/289 |
| 2004/0071018 A1 | * | 4/2004 | Nordal et al. ............... | 365/200 |

OTHER PUBLICATIONS

"A breakthrough in DRAM architecture," *press release*, Innovative Silicon Solutions, Le Landeron, Switzerland, *available at* http://www.globaltechnoscan.com/31stOct-6thNov01/dram_architecture.htm, pp. 1-2, Nov. 2001.
"Reliable Power Recorder," *brochure*, Reliable Power Meters, Los Gatos, CA, pp. 1-8, 2002.
"Holographic Random Access Memory (HRAM)," Proceedings of the IEEE, vol. 87, No. 11, pp. 1931-1940, Nov. 1999.
"Polymer Memory—The plastic path to better data storage," Technology Review, p. 31, Sep. 2002.
"FRAM Technology Backgrounder—An overview of FRAM technology," *technology note*, Ramtron, Colorado Springs, CO, pp. 1-4, Dec. 2000.

(Continued)

*Primary Examiner*—Bryan Bui
*Assistant Examiner*—John Le
(74) *Attorney, Agent, or Firm*—Brinks Hofer Gilson & Lione

(57) ABSTRACT

Methods and devices for monitoring distributed electric power are disclosed, including energy devices with a sensor for monitoring an electric circuit, and a memory to store sensor measurements. Various techniques are disclosed for using polymeric RAM, 1T-DRAM, enhanced SRAM, magnetoresistive RAM, organic RAM, chalcogenide RAM, holographic memory, PLEDM, single-electron RAM, fractal cluster glass memory and other technologies in energy devices with high-endurance, high-density, high-capacity, non-volatile, solid-state, or removable memories.

76 Claims, 3 Drawing Sheets

OTHER PUBLICATIONS

"Ramtron Receives $1.6-Million in FRAM Memory Orders for Use in Ampy Power Meters," *press release*, Ramtron, Colorado Springs, CO, pp. 1-2, Jun. 2001.

"Top Chinese Utility Meter Manufacturers Choose Ramtron's FRAM Memory Products," *press release*, Ramtron, Colorado Springs, CO, pp. 1-2, May 2002.

* cited by examiner

HIGH DENSITY RANDOM ACCESS MEMORY IN AN INTELLIGENT ELECTRIC DEVICE

FIELD OF THE INVENTION

The present invention relates generally to data storage in monitoring and control devices for electrical distribution systems. More particularly, the present invention relates to storing data in memory employed in intelligent electronic devices, such as revenue meters of the type used by energy suppliers to accurately measure electrical energy delivered to consumers.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

In a typical electrical distribution system, electrical energy is generated by an electrical supplier or utility company and distributed to consumers via a power distribution network. The power distribution network is the network of electrical distribution wires which link the electrical supplier to its consumers. Typically, electricity from a utility is fed from a primary substation over a distribution cable to several local substations. At the substations, the supply is transformed by distribution transformers from a relatively high voltage on the distributor cable to a lower voltage at which it is supplied to the end consumer. From the substations, the power is provided to residential and industrial users over a distributed power network that supplies power to various loads. Such loads can include, for example, mechanical motor drives for any of a variety of applications, lights, heating units, HVAC and other environmental applications, computing systems, and a range of other industrial and residential appliances and systems.

At the consumer's facility, there will typically be a protective relay, energy device or other electrical energy meter ("revenue meter") connected between the consumer and the power distribution network so as to measure the consumer's electrical demand. The revenue meter is an electrical energy measurement device which accurately measures the amount of electrical energy flowing to the consumer from the supplier. The amount of electrical energy measured by the meter is then used to determine the amount for which the energy supplier should be compensated.

Typically, the electrical energy is delivered to consumers as an alternating current ("AC") voltage that approximates a sine wave over a time period. The term "alternating waveform" generally describes any symmetrical waveform, including square, sawtooth, triangular, and sinusoidal waves, whose polarity varies regularly with time. The term "AC" (i.e., alternating current), however, almost always means that the current is produced from the application of a sinusoidal voltage, i.e., AC voltage. The expected frequency of the AC voltage, e.g., 50 Hertz ("Hz"), 60 Hz, or 400 Hz, is usually referred to as the "fundamental" frequency. Integer multiples of this fundamental frequency are usually referred to as harmonic frequencies.

While the fundamental frequency is the frequency that the electrical energy is expected to arrive with, various distribution system and environmental factors can distort the fundamental frequency, i.e., harmonic distortion, can cause spikes, surges, or sags, and can cause blackouts, brownouts, or other distribution system problems. These problems can greatly affect the quality of power received by the power consumer at its facility or residence as well as make accurate determination of the actual energy delivered to the consumer very difficult.

In order to solve these problems, devices have been developed to provide improved techniques for accurately measuring the amount of power and quality of power used by the consumer so that the consumer is charged an appropriate amount and so that the utility company receives appropriate compensation for the power delivered and used by the consumer. In addition, devices have been developed to provide protection for electrical distribution by switching off loads that fall outside of set electrical parameters or protecting loads from electrical distribution that falls outside of set electrical parameters. Examples of such energy metering, power quality, and protective relay systems are well known in the art.

While these conventional energy device systems provide information about the quality of the power, i.e., frequency and duration of blackouts, brownouts, harmonic distortions, surges, sags, swells, imbalances, huntings, chronic overvoltages, spikes, transients, line noise, or the like, received by a power consumer at a particular consumer site, they fail to monitor and quantify the power quality with a sufficient level of detail. Blackouts, brownouts, harmonic distortions, surges, sags, swells, imbalances, huntings, chronic overvoltages, spikes, transients and line noise are all examples of power quality events. As utility companies become more and more deregulated, these companies will likely be competing more aggressively for various consumers, particularly heavy power users, and the quality of the power received by the power consumer is likely to be important. This, in turn, means that accurate and detailed reporting and quantification of power quality events and overall power quality will become more and more important as well.

As detailed reporting and operation of these devices is necessary, current technology typically uses random access memory (RAM) to store data. However, current technology of battery backed-up static RAM (BBSRAM) require replacement of a battery and threaten complete loss of memory if the battery fails. Battery backed-up SRAM suffers from higher cost and limited life because of the battery which is needed to retain the data in memory when the system power is off. The life of this backup battery will be affected by temperature which puts restriction of the use of this memory. Current flash memory has a limitation of speed as well as a limitation on the number of erase cycles. While flash memory file systems combined with volatile RAM is a possible solution, this can be very difficult and expensive to design, as the device must try to save data in the flash system from the volatile operating memory before the microprocessor stops operating and the volatile memory is lost. Other standard memory technologies also have limitations. Dynamic RAM (DRAM) is volatile and difficult to integrate, Static RAM (SRAM) is high cost and volatile, and flash has slower writes and limited memory endurance. Accordingly, there is a need for a device or revenue meter to retain measured data, calculated data, and user data in the event of a catastrophic power quality event such as a complete control power failure of the meter, relay, or power quality device.

SUMMARY

The present invention is defined by the following claims, and nothing in this introductory summary section should be understood as a limitation on those claims.

This disclosure describes methods and devices for monitoring electrical parameters in an electric circuit. The methods and devices can be used in applications such as measuring electric power and energy supplied to a consumer from a electric power delivery company. Depending on the application, the devices can be configured as general-purpose power meters, revenue meters, power-quality monitors, power relays, and other instruments.

Described herein is an energy device that includes a sensor to sense an operating characteristic of an electric circuit, such as the instantaneous power, the voltage, or the current of the electric circuit. The sensor generates a sensor signal that indicates the operating characteristic. A memory coupled to the sensor stores data derived from the sensor signal. The memory is (or at least partly includes) high-density memory with an endurance of at least 1,000,000,000 write events.

An A/D converter connects the sensor and the memory, and thus the sensor signal is generated in analog form and digitized for storage in the memory. In one configuration of the energy device, the memory stores digital samples of the measured operating characteristic. The samples may be single instantaneous samples, or collections of samples that represent one or more periods of an electric cycle, or collections of samples that represent only a portion of an electric cycle. Alternatively, or in addition, the energy device may be configured so that the memory stores setup data that controls the operation of the energy device. A data interface coupled to the memory and preferably under the control of a microprocessor makes the data available for output to a user or for transmission to another site on a network.

The high-density memory preferably comprises non-destructive read out ferroelectric random access memory, polymeric ferroelectric random access memory, 1T-DRAM, enhanced SRAM, magnetoresistive random access memory, organic random access memory, chalcogenide random access memory, holographic random access memory, holographic storage, phase-state low-electron drive memory, or single-electron random access memory, or combinations of these, or combinations of one or more of these types of memory in conjunction with other types of memory.

This disclosure also presents an intelligent electronic device ("IED") for measuring the delivery of electrical energy from an energy supplier through an electric circuit. The IED includes (1) a sensor that indicates an operating characteristic of the electric circuit (such as voltage, current, or instantaneous power), and coupled to the sensor, (2) a high-capacity solid-state memory. In various preferred embodiments, the high-capacity solid-state memory includes at least 128 megabytes, 512 megabytes, 2 gigabytes, 10 gigabytes, 25 gigabytes, or 100 gigabytes of storage capacity. The solid-state memory is preferably removable from the IED, facilitating information retrieval, repair, and upgrades. Various types of memory are contemplated for the high-capacity solid-state memory, such as magnetoresistive RAM, holographic RAM, and fractal cluster glass RAM, among others.

Further aspects and advantages of the invention are discussed below in conjunction with the preferred embodiments.

DETAILED DESCRIPTION OF THE PRESENTLY PREFERRED EMBODIMENTS

Figure 1:
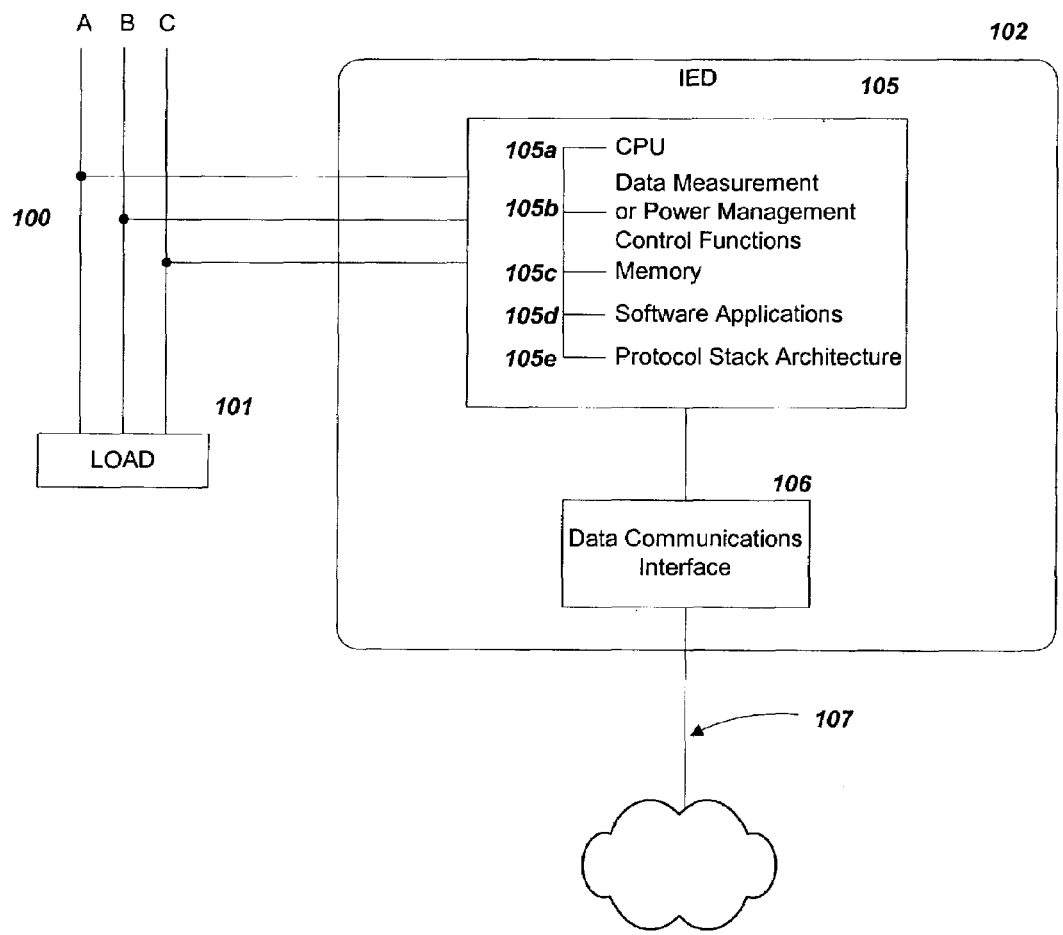
FIG. 1 illustrates a block diagram of an intelligent electronic device (IED).

Intelligent electronic devices ("IED's") such as programmable logic controllers ("PLC's"), Remote Terminal Units ("RTU's"), electric/watt hour meters, protection relays, fault recorders, and others are widely available that make use of memory and microprocessors to provide increased versatility and additional functionality. Such functionality includes the ability to communicate with remote computing systems, either via a direct connection, e.g. modem or via a network. In particular, the monitoring of electrical power, especially the measuring and calculating of electrical parameters, provides valuable information for power utilities and their customers. Monitoring of electrical power is important to ensure that the electrical power is effectively and efficiently generated, distributed, and utilized. Various different arrangements are presently available for monitoring, measuring, and controlling power parameters. Typically, an IED, such as an individual power measuring device, is placed on a given branch or line proximate to one or more loads that are coupled with the branch or line in order to measure/monitor power system parameters. Herein, the phrase "coupled with" is defined to mean directly connected to or indirectly connected through one or more intermediate components.

As used herein, Intelligent electronic devices ("IED's") include Programmable Logic Controllers ("PLC's"), Remote Terminal Units ("RTU's"), electric power meters, protective relays, fault recorders, and other devices that are coupled with power distribution networks to manage and control the distribution and consumption of electrical power. Such devices typically utilize memory and microprocessors executing software to implement the desired power management function. IED's include on-site devices coupled with particular loads or portions of an electrical distribution system and are used to monitor and manage power generation, distribution and consumption. IED's are also referred herein as power management devices ("PMD's").

An energy device is an IED device used to monitor at least one electrical parameter from an electrical circuit.

One type of data interface is a communication interface such as an Ethernet, modem, serial port, parallel port, optical port, etc. An alternate data interface is a user interface, such as a display or keypad. An alternate data interface facilitates transfer of data between the microprocessor, additional microprocessors, memory devices, display controller, analog to digital converters, etc.

A Remote Terminal Unit ("RTU") is a field device installed on an electrical power distribution system at the desired point of metering. It is equipped with input channels (for sensing or metering), output channels (for control, indication or alarms) and a communications port. Metered information is typically available through a communication protocol via a serial communication port. An exemplary RTU is the XP Series, manufactured by Quindar Productions Ltd. in Mississauga, Ontario, Canada.

A Programmable Logic Controller ("PLC") is a solid-state control system that has a user-programmable memory for storage of instructions to implement specific functions such as Input/output (I/O) control, logic, timing, counting, report generation, communication, arithmetic, and data file manipulation. A PLC consists of a central processor, input\output interface, and memory. A PLC is designed as an industrial control system. An exemplary PLC is the SLC 500 Series, manufactured by Allen-Bradley in Milwaukee, Wis.

A meter is a device that records and measures characteristics such as power events, power quality, current, voltage waveforms, harmonics, transients and other power disturbances. Revenue accurate meters ("revenue meter") relate to revenue accuracy electrical power metering devices with the ability to detect, monitor, report, quantify and communicate information about the quality and quantity of the power which they are metering. An exemplary meter is the model 8500 meter, manufactured by Power Measurement Ltd, in Saanichton, B.C. Canada.

A protective relay is an electrical device that is designed to interpret input conditions in a prescribed manner, and when specified conditions are met, to cause contact operation or similar abrupt changes in associated electric circuits. A relay can include several relay units, each responsive to a specified input, with the combination of units providing the desired overall performance characteristics of the relay. Inputs are usually electric or electronic, but they can alternatively be mechanical, thermal, or based on some other physical quantity, or a combination thereof. Exemplary relays are the types N and KC, manufactured by ABB in Raleigh, N.C..

A fault recorder is a device that records the status of power transmission lines to identify errors and undesirable conditions in the power transmission. Fault recorders can take as inputs the voltage waveform, current waveform, or various digital inputs, such as breaker status. These inputs can indicate situations such as a fault in a line, which may be caused by a break in the line. Like meters designed particularly for monitoring power quality, fault recorders are examples of instruments sometimes referred to as power quality devices. An exemplary fault recorder is the IDM, manufactured by Hathaway Corp in Littleton, Colo.

IED's can also be created from existing electromechanical meters or solid-state devices by the addition of a monitoring and control device that converts the mechanical rotation of the rotary counter into electrical pulses or monitors the pulse output of the meter. An exemplary electromechanical meter is the AB1 Meter manufactured by ABB in Raleigh, N.C..

Revenue accuracy electrical meters ("revenue meters" or "meters") are metering devices that indicate or record electrical energy and demand (the average power or a related quantity over a specified interval of time) for the purpose of compensating the electric utility for the energy consumption of the end user. Energy is typically the primary billing quantity and is equal to power integrated over time. Energy is measured in Kilowatt Hours ("KWH") and demand is measured in Kilowatts ("KW"). Note that some consumers of electrical energy may also have generation capability. In a situation where a consumer is generating more energy than he is consuming, that energy will flow back to the utility and the consumer will be compensated appropriately. Effectively, a consumer with excess generation capacity becomes a supplier and the utility becomes the consumer. The methods, systems and apparatuses disclosed below are equally applicable to this alternative situation.

FIG. 1 illustrates a high level functional block diagram of an IED. The IED 102 is preferably coupled with a load 101 via a power a distribution system 100, or portion thereof. The IED 102 includes device circuitry 105 and a data communications interface 106. The IED 102 is further coupled with a network 107. It can be appreciated that a network connection can be established by Ethernet, RS232, RS435 or other connections known in the art. The device circuitry 105 includes the internal hardware and software of the device, such as the CPU 105a, memory 105c, firmware and software applications 105d, data measurement functions 105b and communications protocol stack 105e. The data communication interface 106 couples the device circuitry 105 of the IED 102 with the communications network 107. In some alternate embodiments, power management control functions 105b replace or supplement data measurement circuitry. For example, some embodiments of a relay include a control device and corresponding control functions that regulate electricity flow to a load based on preset parameters. Similarly, a revenue meter can include data measurement circuitry that logs and processes data from a connected load. Various embodiments of IED's include one or the other or combinations of circuitry. In one embodiment, the circuitry includes phasor monitoring circuits (not shown) with phasor transducers that receive analog signals representative of parameters of electricity in a circuit over the power distribution system.

Figure 2:
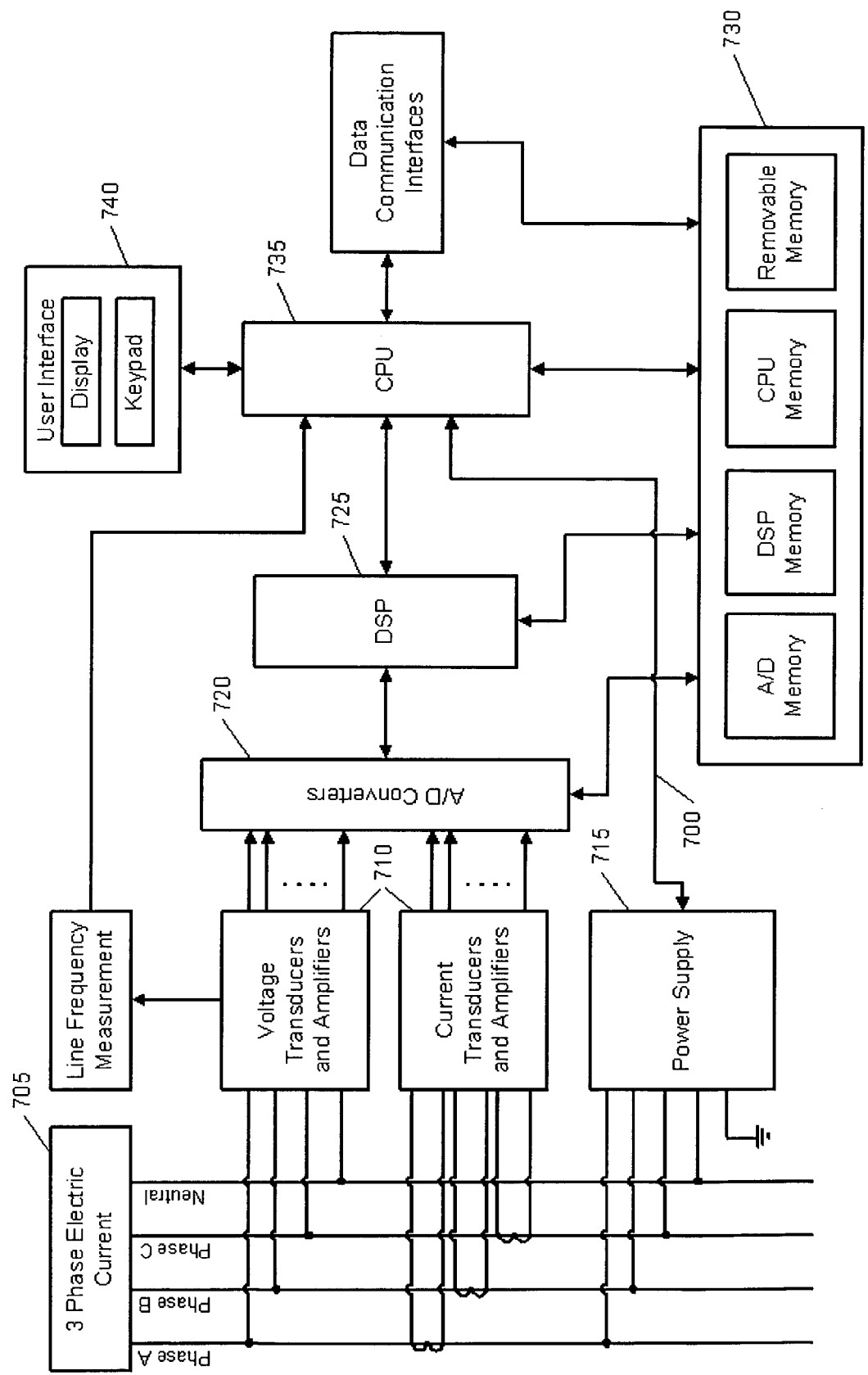
FIG. 2 illustrates a block diagram of an energy meter.

FIG. 2 illustrates a functional block diagram of an energy meter that can detect, record and report power quality events. Logically, the preferred embodiment revenue meter is comprised of hardware and software. FIG. 2 shows a typical hardware configuration where the meter 700 is coupled with a three phase electric circuit 705. The meter 700 includes transducers 710 which sense the current and voltage in each phase of the electric circuit 705 and a power supply 715 which supplies power for the meter electronics. The transducers 710 are also connected to an analog to digital ("A/D") converter 720 which samples the current and voltage in each phase of the electric circuit 705. In other embodiments of the energy meter, the transducers measure only the voltage or voltages of the electric circuit. In yet other embodiments of the energy meter, the transducers measure only the current or currents delivered by the electric circuit.

The digital output of the A/D converter 720 is connected to a digital signal processor 725 ("DSP"). The DSP 725 is connected to memory 730 and to a central processing unit 735 ("CPU"). The memory 730 preferably includes non-volatile storage memory and non-volatile random access memory (RAM). The DSP 725 in conjunction with the CPU 735 executes the power quality event detection and reporting algorithms. Note that the preferred embodiment algorithms operate on samples as provided by the DSP 725 and CPU 735. In one embodiment the algorithms operate on all samples provided; in an alternate embodiment the operate only on a subset of the provided samples. A preferred implementation of the algorithms operates utilizing 64 samples, which represents ½ cycle. It will be appreciated however, that these computations can be performed with a greater or lesser number of samples (with the corresponding buffers adjusted accordingly), e.g. representing a quarter cycle or eighth of a cycle, down to a single sample. The processing power of the DSP 725 and CPU 735 is a limiting factor.

As further shown in FIG. 2, the CPU 735 is also connected to a user interface 740 which allows users to program the meter 700 or retrieve revenue or power quality data and generally interact with the meter 700. In the preferred embodiment, the user interface 740 includes a graphical display and a keypad as well as LED, infrared and optical interfaces. It will be appreciated by those skilled in the art that the power quality detection and reporting algorithms detailed herein can be executed by a variety of hardware configurations. It can be appreciated that a single IED comprises both protective relaying and metering functionality.

The memory 730 used in the meter 700 can be used to store data such as but not limited to digital samples of electrical parameters, setup data that can be used to control operation of the device, data about the environment the meter is situated within, information of electrical network, and location of the meter.

The memory 730 used in the meter 700 can have limitations on write/erase endurance, ability to retain data (destructive or non destructive), rate of refresh, density, access time and erase size and erase/programming speed.

Random Access Memory (RAM) is a type of digital memory where any piece of information can be accessed in any order.

Solid state memory is a type of digital memory without moving parts. Typically a solid state memory has a larger environmental specification and durability than a memory that incorporates moving mechanical parts, such as a hard drive where a disc is spinning and a mechanical head is used to read the data from the spinning disc. A solid state memory is generally less sensitive to mechanical vibration, mechanical shock, temperature, and humidity. For example, a device that uses a hard disk typically has a operating temperature range of 0 to 50 degrees C., by comparison, many devices using only solid state memory have a temperature range of −40 to 85 degrees C. By using solid state memory, the IED device has the advantage of being less sensitive to mechanical vibration and shock, allowing it to be mounted closer to large motors and generators. In addition, it is less sensitive to temperature and humidity allowing the IED devices to be mounted in more diverse locations without expensive environmental controls.

Memory endurance is defined as the number of memory erase or write cycles the memory can withstand before the bits of the memory start to intrinsically fail due to excessive fatigue. Memory endurance of a memory device is defined as the number of erase cycles that a memory device can withstand before one bit of memory in the device fails. For example, after roughly 1,000,000 erase cycles, flash memory is no longer able to reliably store data. A memory endurance of only 1,000,000 would cause a memory being written to ten times a second to be fatigued in less than 28 hours. In comparison, a memory with a memory endurance of 1E9 times would fatigue in 3.17 years. In the preferred embodiment unlimited memory endurance is defined as memory that has a erase and write endurance of at least 1E9 cycles and preferably as high as 1E10, 1E11, or 1E12 writes and/or erases.

The ability to retain data is also a limitation of some memory. Destructive readout (DRO) memory must re-write the contents of each memory cell as it is read otherwise the data is lost or corrupt. Non destructive readout (NDRO) memory is able to be read multiple times between each write cycle. NDRO memory often has the advantage of having an inherently faster read cycle as there is no requirement to write the data after the read to maintain data integrity. In addition, NDRO memory read cycles contribute less to the memory endurance fatigue of the device. DRO memory has the disadvantage adding to the memory endurance fatigue of the device with each read as each read requires a write cycle to maintain data integrity. This can be a large disadvantage as memory may be read multiple times without the data in the memory cell changing. For example, if the microprocessor writes data once to a memory cell and throughout operation reads the data nine times, DRO memory would have been written to ten times total and NDRO memory would only have had to be written once. The additional writes required in the DRO memory further fatigues the device in addition to inherently slowing the access or availability to the DRO memory as compared to the NDRO memory.

Refresh rate is defined as the rate of regular recharging or rewriting of memory cells to stop the data from being lost. Volatile memory requires either a refresh or power to retain memory and is unable to reliably hold data longer than one minute after all power sources are removed from the device. For example, DRAM requires a few thousand refresh cycles per second to prevent data from being lost as the capacitor used to store the data loses charge over time.

SRAM does not require a refresh cycle; however, it does require a constant power source to maintain memory. In some cases, a battery is used to provide the power required to maintain memory in a memory chip; however, this approach requires a replacement of a battery and threatens complete loss of memory if the battery fails. Battery backed-up SRAM suffers from higher cost and limited life because of the battery which is needed to retain the data in memory when the system power is off. The life of this backup battery will be affected by temperature which puts restrictions on the use of this memory. Non-volatile memory is memory that can retain its data contents for at least one minute and preferably as long as one, five, or ten years without power or refresh cycles. Non-volatile memory has many advantages when used in IEDs. One advantage is the simplification of the firmware and hardware design as when using non-volatile memory as operating memory, it is not necessary to detect a loss of power for the purposes of writing important data out of volatile memory into non-volatile storage memory. In addition, using non-volatile memory as operating memory allows the device to instantly continue operation when power is restored. This has the advantages of removing lengthy delays associated with the microprocessor reloading & reinitializing memory from non-volatile storage into the operating memory, as the operating memory itself is non-volatile storage. For example, in one implementation of a metering IED, revenue measurements are monitored, relay protection is restored, and power quality can be monitored the as soon as control power is restored to the device. Previously, there was a significant startup delay when control power was restored to a device that uses volatile operating memory when the memory and the microprocessor were initialized. In addition, the use of non-volatile memory eliminates the need for a battery to backup any portion of the memory, which in turn reduces end-user maintenance and eliminates the risk of memory loss if the battery is not replaced or fully charged. This reduces the need for the meter to be regularly powered down for battery servicing.

Density is also a limitation of memory. High density memory is defined as memory technology in which each digital bit of data takes one or more resistive elements, one or more magnetic elements, no capacitive elements, and the transistors required take up no more linear silicon die area than a single transistor would require. In addition, high density memory may use a polymer, film, or various media layers, etc. to store data. This does not include shared circuits or logic required to read or write the bits of data. High density memory is typically easier and cheaper to, produce than standard memory types such as, but not limited to, SRAM, DRAM, DRO FeRAM, BBSRAM. As high density memory can be used to produce memory chips with larger amounts of internal RAM, using a high density memory chip typically takes up less space on a printed circuit board, resulting often in an easier electrical design, simpler circuit board layout, simpler microprocessor programming, and lower required production inventory levels. In addition, other components in the IED such as but not limited to the digital signal processor, microprocessor, or analog to digital converter—preferably include a high density memory that can be used for the operation of the IED, further removing the need for any dedicated memory chips and thus adding to the advantages stated above. Some configurations of a high density memory chip may contain a small portion of memory cells that are not high density. For example, this design can be used to increase the overall through-put of the memory chip interface to implement a cache. This cache is typically less than one quarter of the whole memory space.

High density memory is an important technology to IED devices as it makes it possible to implement large amounts of solid state storage space in an IED device. Normally IED devices are unable to contain large amounts of memory due to physical constraints placed on these devices allow only a limited number of circuit boards thereby limiting the amount of real estate for placing memory devices once other components such as microprocessor devices, data interface controllers, etc. IED devices preferably contain high density memory, which allows them to contain larger amounts of storage space such as 128 megabytes, 512 megabytes, 1 gigabyte, 25 gigabytes, and much larger. This facilitates the stringent power quality, data logging, and event logging required in locations without adequate communications such as a remote location or a meter capable of recording data and displaying over large time spans without the need for further external storage or communication. Additional benefits of using a high density memory in an IED device is that high density can be used to produce memory chips with larger amounts of internal RAM, using a high density memory chip typically takes up less space on a printed circuit board, resulting often in an easier electrical design, cheaper to design and purchase, simpler circuit board layout, simpler microprocessor programming, and lower required production inventory levels. An alternative implementation of the IED device would allow a database of digital samples to be stored in the large memory space over a period time span, preferably over one year, with built in post event processing and reporting tools.

Radiation hard is a term used to describe memory technology where the information stored in the memory device is not susceptible to outside radiation. Memory errors are usually classified as either soft or hard. Soft errors are impermanent and are usually caused by charged particles from naturally occurring background radiation or cosmic rays. Hard errors can be caused by defects within the memory package among other reasons, and are usually permanent once they appear. As memory becomes denser, it is more susceptible to charged particles or cosmic rays. Both DRAM and SRAM suffer soft errors from both alpha radiation due to low levels of natural radioactive contamination in the packaging and process materials or from natural background neutron radiation. A memory technology that is radiation hard technology is advantageous as it is not susceptible to background radiation therefore creating a more bit-stable memory storage and more stable microprocessor operation.

Access time in RAM devices is the time from the start of accessing one piece of memory to the time when a second access can be started. The benefit of shorter access times is a timesaving in the data transfer time. Shorter access time overall takes up less microprocessor cycles than a device with a longer access time.

Memory erase size is the minimum amount of memory that can be erased in a memory chip. For example, the memory erase size of UV erasable eprom is the complete chip as UV erasable eprom only allows a full erase of memory. In contrast, FLASH memory allows a sector erase and SRAM allows the smallest addressable single memory location to be erased independently. The larger than smallest addressable memory location erase sizes make it difficult to use the memory technology as a operating memory.

Programming speed is defined as the time associated with any required memory erase and the write access time of the device. Eprom, UV Eprom, EEProm, and Flash memory have programming speed that is significantly longer than their read speed. Typically Eprom, UV Eprom, EEProm, and Flash memory have programming speed that is at least an order of magnitude larger than the read speed making designs with these memory technologies more complicated and have slower performance. Memory such as but not limited to MRAM have programming speed that are typical less than 100 ns.

In one preferred embodiment, the memory 730 in FIG. 2 employs one of the following types of high density RAM: magnetoresistive RAM, polymeric ferroelectric RAM, polymer RAM, holographic RAM, organic RAM, 1T-DRAM, ESRAM, C-RAM, Ovonic Unified Memory, phase-state-low-electron-drive memory, or single electron memory. Other embodiments of the energy meter can use combinations of these types of memory, other types of memories, or combinations of these types of memory and others. Each of these types of high density RAM are described in more detail below.

Memory devices are usually only part of an overall system that can further include processing devices, controllers, and various other analog functional modules and devices.

Ferroelectric Random Access Memories (FeRAM) use ferroelectric materials to store information. FeRAMS come in various forms. Two of the main types are: destructive read-out ferroelectric random access memory (DRO FeRAM) and non-destructive read-out ferroelectric random access memory (NDRO FeRAM).

DRO FeRAM typically uses Ferroelectric (FE) film to acts as a storage capacitor. The read operation is based on monitoring currents caused by polarization changes when a voltage is applied. This causes a memory read cycle to be destructive. Each time a read cycle is performed on DRO FeRAM the memory must be written back to the cell to prevent data loss. This is undesirable due to the time required to write the same data back to the cell and due to the limited write endurance of FeRAM. An exemplary DRO FeRAM is the FM24C Series, manufactured by Ramtron International Corporation in Colorado Springs, Colo., USA.

NDRO FeRAM uses FE film to acts as a gate in a field effect transistor (FET). The read operation is based on changes in threshold voltages of the transistor according to the polarization direction, thus the memory read cycle is non-destructive. This means that memory can be read over and over without the requirement of a write to preserve the memory cell. This has a benefit of being inherently faster and having significantly increased endurance because to no write is required when a read is performed, as opposed to DRO FeRAM. In addition, as this memory does not use a capacitive element in its architecture, it is a high density memory. This is a significant benefit of NDRO FeRAM as compared to a lower density memory such as DRO FeRAM as the memory chips that are created with NDRO FeRAM are cheaper to produce, have larger memory sizes, and simplify printed circuit board (PCB) design. NDRO FeRAM has a low cost per bit and low power consumption as no cell standby power or refresh is required.

The role and properties required of functional materials in these two memory types are distinctly different. For DRO, the read operation is based on monitoring currents caused by polarization changes when a voltage is applied. This causes the memory to be erased and require re-writing. For NDRO, the read operation is based on changes in threshold voltages of the transistor according to the polarization direction. These constructions are either Metal Ferroelectric Semiconductor (MFS) FETs or Metal Ferroelectric Metal Insulator Semiconductor (MFMIS) FETs.

A Magnetic Random Access Memory (MRAM) is a type of solid-state memory. Its active portion is different from that of standard semiconductor memory. In general, a magnetic memory element has a structure that includes ferromagnetic layers separated by a non-magnetic layer. Information is stored as directions of magnetization vectors in magnetic layers. Magnetic vectors in one magnetic layer, for instance, are magnetically fixed or pinned, while the magnetization direction of the other magnetic layer is free to switch between the same and opposite directions, thereby storing information in "Parallel" and "Antiparallel" states, respectively. In response to Parallel and Antiparallel states, the magnetic memory element represents two different resistances. The resistance indicates minimum and maximum values when the magnetization vectors of two magnetic layers point in substantially the same and opposite directions, respectively. Accordingly, a detection of changes in resistance allows an MRAM device to provide information stored in the magnetic memory element.

MRAM technology is very versatile and cost effective and is intended to replace other memory types including FLASH-type memories, dynamic RAMS (DRAMs), static RAMs (SRAMs), etc. Compared to a semiconductor memory, this magnetic thin-film memory has the advantages of fast read and write performance, the ability to retain stored data when the power supply is shut down, the ability for data to be repetitively rewritten an unlimited number of times, and a high resistance to losing recorded contents under the incidence of radiation. MRAM typically has access speeds of 35 ns or faster, it is non-volatile memory, and its architecture is considered high density. MRAM has a relatively low cost per bit and a relatively low power consumption, as no cell standby power or refresh is required.

Polymeric Ferroelectric random access memory (PFeRAM) is a solid state memory where data is stored by changing the polarization of the polymer between metal lines. Advantages of this memory type are that the polymer layers can be stacked, which creates a high density memory. PFeRAM memory is non-volatile, and has fast read and write speeds. In addition, PFeRAM has a very low cost per bit and low power consumption, as no cell standby power or refresh are required.

Polymer random access memory is a solid state memory with each memory cell consisting as a polymer sandwiched between two electrodes. Application of an electric field to a cell lowers the polymer's resistance, thus increasing its ability to conduct current. The polymer maintains its state until a field of opposite polarity is applied to raise its resistance back to its original level. Bits of information are represented by the different conductivity states. As polymer memory cells are about one-quarter the size of conventional silicon cells and as they can be stacked to produce a three-dimensional structure, polymer random access memory can potentially store far more data than other nonvolatile alternatives. Polymer memory is high density memory. The polymer film can be read in two modes, either destructive read out or non-destructive read out. In the first case, reading speed is symmetric with write. Depending on how the polymer is processed and initialized this speed can range from nanoseconds to microseconds. This speed symmetry puts the polymer film memory in a favorable position versus some other types of non-volatile memory, for example flash, where the erase before write may be orders of magnitude slower than the read. In the non-destructive read mode the Thin Film memory speed is comparable to or better than DRAM read speeds. In addition, as the polymer maintains its last resistive state without power, the memory is nonvolatile. Furthermore, since the polymer memory cells are non-volatile, no refresh is required (un like DRAM), nor is any voltage required from an external power supply to maintain information (unlike SRAM). DRO PRAM and NDRO PRAM have a low cost per bit and low power consumption as no cell standby power or refresh are required.

One transistor dynamic RAM (1T-DRAM) is different from DRAM architecture as it only uses the transistor to store data; 1T-DRAM removals the capacitor from the architecture. As 1T-DRAM only uses one transistor to store the data bit, it is a high density memory technology that simplifies the design of the memory cell and allows a greater amount of information to be stored on the same amount of linear silicon area. In addition, as 1T-DRAM is high density, it is comparatively inexpensive to produce. Memory chips using this design can be made to include higher amounts of RAM within the chip, which simplifies design of the IED.

Enhanced SRAM (ESRAM) is a mix of ultrafast DRAM without the capacitor in the DRAM architecture, with a fast SRAM cache. By removing the capacitor from the DRAM architecture, the memory can be made high density, in addition to increasing the speed of the DRAM. This memory has a fast access speed, similar to SRAM, of 10 ns or faster; however, as a significant portion of this memory is a DRAM architecture without the capacitor, it is typically cheaper to produce and high density. Chips using this design can be made to have fast access times and higher amounts of RAM within one chip which simplifies design of the IED.

Holographic random access memory (HRAM) provides very large storage density (high density memory), is non-volatile, and operates at high speed. Information is recorded in the holographic medium through the interference of two coherent beams of light. The resulting interference pattern causes an index grating (hologram) to be written onto the recording medium or crystal structure. When the hologram is subsequently illuminated with one of the original beams, light is diffracted from the grating so that the other original beam is reproduced. Many holograms can be multiplexed within the same volume of material by various multiplexing methods, such as angle, fractal, wavelength, phase code, peristrophic, and shift multiplexing. One specific advantage to using holographic random access memory is that each access to the memory yields an entire data page which can typically hold more than a megabit at a time. This significantly increases transfer rate of information either reading or writing the memory.

Holographic storage provides very large storage density, is nonvolatile, and has a high transfer rate. The storage mechanism is similar to holographic RAM with the exception that the storage media is typically a removable, optical disc. The portion of the disc that either contains the required data to be read or is the space to have data written must be positioned correctly so that the specific piece of media is accessible to beams of light required to write and read the disc. As this memory may require mechanical, moving parts it is not considered solid-state memory; however, holographic storage is desirable due to the transfer speed, non-volatility, high density, and hardness to external radiation.

Organic random access memory uses a reversible structural phase-change from the amorphous phase to a crystalline phase similar to the way data is stored on a recordable compact disk. Typically organic RAM has a memory endurance greater than 1E13. Organic RAM is a high density memory with access time typically 50 ns or less. In addition, Organic RAM can be made to have a very low refresh rate or further processed to be non-volatile memory.

Chalcogenide random access memory (C-RAM) this is also called Ovonic Unified Memory (OUM) in which a thin-film chalcogenide alloy material is the data storage mechanism. The small volume of active media in each memory cell acts as a fast programmable resistor, switching between high and low resistance with a greater than 40× dynamic range. C-RAM is a high density memory with access time typically 50 ns or less. Chalcogenide alloys exhibit electronic threshold switching, thus allowing memory cells to be programmed at low voltage whether they are in the resistive or conductive state. C-RAM memory is non-volatile and has extraordinary cycle life typically greater than 1E13 cycle memory endurance without failure. In addition to this, C-RAM has a low standby current less than 1 uA and is radiation hard.

Phase-state-low-electron-drive memory (PLEDM) is a solid state memory that stacks a small transistor on the gate of a conventional MOSFET in a vertical orientation so that they take up no more linear-silicon-die area than a single transistor would require and therefore is considered high density. In general, barriers block current flow with the small transistors gate modulating the barriers. In some implementations of the PLEDM, once the electron enters and becomes trapped in a quantum-dot region between a gate and a reservoir, the Coulomb forces that result block subsequent electron transfer. Current deployments of this technology use approximately one hundredth of the electrons required by conventional DRAM to store one bit of data. This efficiency allows PLEDMs to store considerably more data in comparison to conventional memory devices. As the data writing transistor stores electrons firmly, refresh load for maintaining the signal is lighter and therefore the power consumption is greatly reduced compared to DRAM or SRAM. By further optimization of the transistor structure, it is possible to produce PLEDM memory that is non-volatile, meaning that no refresh is required. PLEDM memory technology typically allows reads and writes in the order of 10 nanoseconds or less. Using PLEDM technology in a revenue meter or relay device generally reduces cost and power consumption in the device.

Single electron memory (SEM) memory is a single-electron device that utilizes one-electron-precision charge transfer based on the Coulomb blockade effect for its operation and storage of digital bits. The advantages of using SEM memory are low voltage operation and low power consumption. In addition, SEM offers long-term non-volatile storage.

Fractal cluster glass memory is a solid state memory that typically uses photo-induced magnetism in a magnetic polymer material to store data. The memory uses a new form of magnetism characterized by fractal fields. As the polymer's dimensions are reduced, the photo induced magnetic dimension of the field becomes fractal and is useable as a high density and non-volatile memory type. The light-controlled magnetic materials are used to store the data. Fractal cluster glass random access memory is desirable due to high density, non-volatile, and hardness to external radiation.

An alternative form of fractal cluster glass memory is storage on a disc. The storage mechanism is similar to fractal cluster glass RAM with the exception that the storage media is typically a removable, optical disc. The portion of the disc that either contains the required data to be read or is the space to have data written must be positioned correctly so that the specific piece of media is accessible to beams of light required to write and read the disc. As this memory requires mechanical, moving parts it is not considered solid-state memory; however, fractal cluster glass storage is desirable due to the transfer speed, non-volatility, the high density, and hardness to external radiation.

Using high density memory technologies can afford several advantages in an IED device. For example, high-density memory can provide a cheap-to-produce high amount of solid state memory in a single device. This allows large amounts data to be stored in the solid state device. This data could include, but is not limited to, trend data, power quality data, security data, and image sensing data. This large, solid state data storage in an IED is valuable when the IED is installed at a remote location with expensive, intermittent, or non-existent communications. In addition, solid state storage is able to operate over a large environmental range. This is a big advantage over technology that incorporates a hard drive due to the environmental limitations on hard drives, in addition to the speed of operation, design complexity, and risk of mechanical failure.

Advantages to using non-volatile operating memory—such as but not limited to magnetic RAM, polymer RAM, or organic memory—in a IED include eliminating the minimum write cycles found in non-volatile memory such as flash, eliminating the replacement of batteries in a meter such as battery backed up SRAM, simplifying of design process as there is no need to design power ride through to backup operating memory on power failure, and enabling the revenue meter or relay device to operate instantly when control power is restored to the device. Memory devices are usually only part of an overall system that can further include processing devices, controllers, and various other analog functional modules and devices.

It is to be noted that suitable transistor sizes specifying channel width-to-length ratios (measured in micrometers or microns) for the transistors which make up the depicted circuits have been omitted from the figures. It will be appreciated that suitable ratios are preferably chosen depending on the design requirements and the capabilities and limitations of the particular integrated circuit, fabrication process used for implementation of the circuit, and the performance requirements of the specific embodiment.

Figure 3:
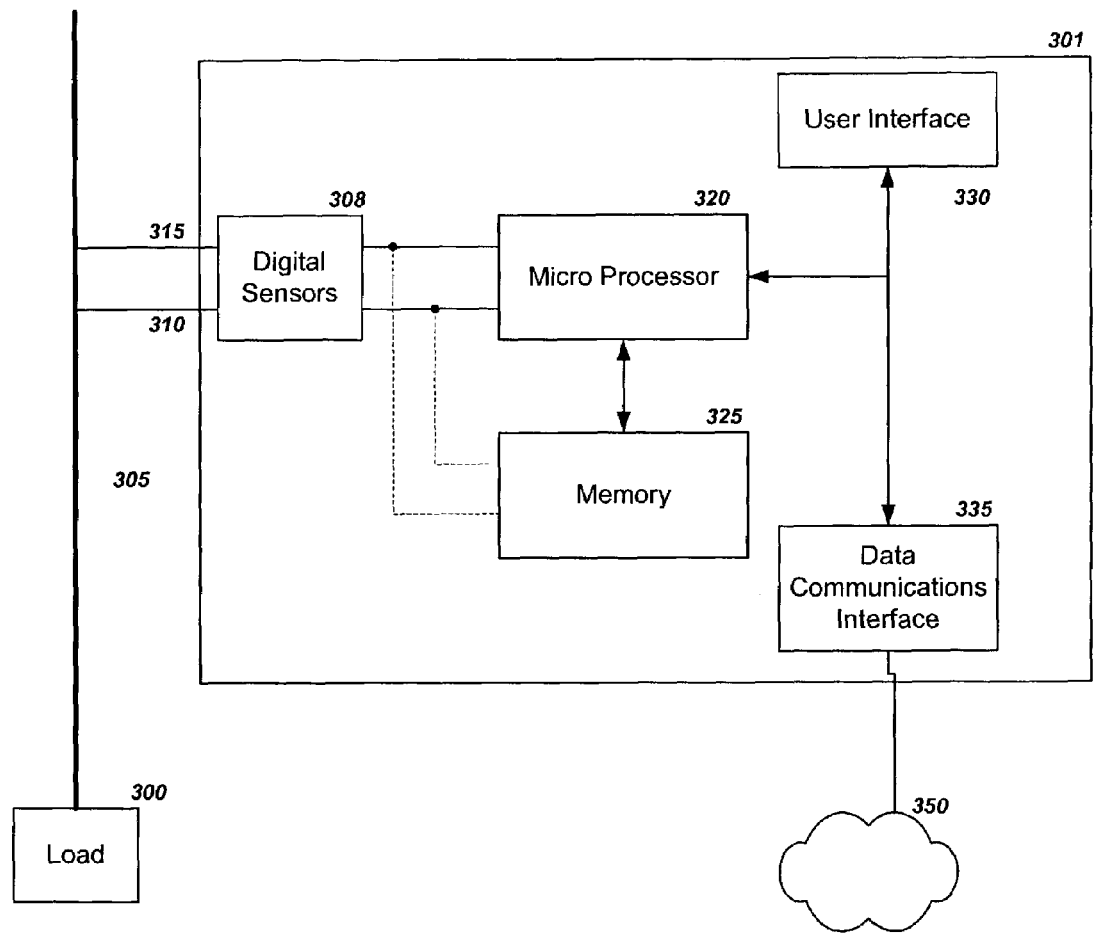
FIG. 3 illustrates an alternate embodiment of an IED.

FIG. 3 shows a block-diagram implementation of an IED 301 incorporating a microprocessor 320. Digital sensors 308 are connected to microprocessor 320, which preferably includes a digital signal processor and a central processing unit (CPU). The digital sensors 308 include voltage and current transducers and amplifiers which sense and measure current 315 and voltage 310 from the power distribution network or load 300. Microprocessor 320 is connected to memory 325, which includes non-volatile storage memory and non-volatile random access memory (RAM). In one embodiment of the IED, the RAM is a magnetoresistive RAM. Other embodiments of the IED employ polymeric ferroelectric RAM, polymer RAM, holographic RAM, organic RAM, Ovonic Unified Memory, phase-state-low-electron-drive memory, or single electron memory, or combinations of these in the RAM of memory 325. It can also be appreciated that the memory 325 can be removable from the IED 301. Alternately, the digital sensors 308 can be coupled to the memory 325, thus allowing the digital sensors 308 to directly store sensed data into the memory 325.

As FIG. 3 further shows, the microprocessor 320 is preferably also coupled to a data communications interface 335, which couples the device circuitry of the IED 301 with a communications network 350. The microprocessor 320 executes the power event detection and reporting algorithms as well as other logic commands. The microprocessor 320 is also connected to a user interface 330 which allows users to program the IED 300 or retrieve revenue or power quality data and generally interact with the IED 300. In a preferred embodiment, the user interface 330 includes a graphical display, such as a touch screen or LCD, and a keypad as well as LED, infrared and optical interfaces.

It is to be understood that multiple variations, changes and modifications are possible in the aforementioned embodiments of the invention described herein. Although certain illustrative embodiments of the invention have been shown and described here, a wide range of modification, change, and substitution is contemplated in the foregoing disclosure and, in some instances, some features of the present invention may be employed without a corresponding use of the other features. Accordingly, it is appropriate that the foregoing description be construed broadly and understood as being given by way of illustration and example only, the spirit and scope of the invention being limited only by the appended claims.

We claim:

1. An energy device for monitoring electrical energy delivered through an electric circuit, the energy device comprising:
    a sensor configured to sense an operating characteristic of the electric circuit and generate digital samples indicative of the operating characteristic;
    a memory coupled to the sensor, the memory including at least one portion of high density non-volatile memory, the memory having an endurance of at least 1,000,000,000 erase events, at least a portion of the memory being configured to store data, wherein the memory is further operative to store operating data and is ready to provide device operations to at least one microprocessor as soon as power is applied to the energy device;
    at least one data interface; and
    the microprocessor coupled to the memory and to the data interface, the microprocessor configured to provide the data from the memory to the data interface.

2. The energy device of claim 1, wherein the sensor comprises an analog sensor configured to generate an analog signal indicative of the operating characteristic; and, an analog to digital converter coupled with the sensor and operative to convert the analog signal to one or more digital samples.

3. The energy device of claim 1, wherein the sensor comprises a digital sensor configured to directly generate one or more digital samples indicative of the operating characteristic.

4. The energy device of claim 1, wherein at least one data interface is an external communication port.

5. The energy device of claim 1, wherein at least one data interface is a user display.

6. The energy device of claim 1, wherein the operating characteristic is the voltage of the electric circuit.

7. The energy device of claim 1, wherein the operating characteristic is indicative of current delivered through the electric circuit.

8. The energy device of claim 1, wherein the operating characteristic is indicative of energy delivered through the electric circuit.

9. The energy device of claim 1, wherein the energy device is a revenue meter and the data stored in the memory is indicative of energy supplied to a consumer site.

10. The energy device of claim 1, wherein the energy device is a relay.

11. The energy device of claim 1, wherein the energy device is a power quality device.

12. The energy device of claim 1, wherein the data comprises digital samples.

13. The energy device of claim 1, wherein the data comprises setup data.

14. The energy device of claim 1, wherein the high density memory comprises non-destructive read out ferroelectric random access memory.

15. The energy device of claim 1, wherein the high density memory comprises polymeric ferroelectric random access memory.

16. The energy device of claim 1, wherein the high density memory comprises one transistor dynamic RAM (1T-DRAM).

17. The energy device of claim 1, wherein the high density memory comprises enhanced SRAM.

18. The energy device of claim 1, wherein the high density memory comprises magnetoresistive random access memory.

19. The energy device of claim 1, wherein the high density memory comprises organic random access memory.

20. The energy device of claim 1, wherein the high density memory comprises chalcogenide random access memory.

21. The energy device of claim 1, wherein the high density memory comprises holographic random access memory.

22. The energy device of claim 1, wherein the high density memory comprises phase-state low-electron drive memory.

23. The energy device of claim 1, wherein the high density memory comprises single-electron random access memory.

24. The energy device of claim 1, wherein the device is operational upon the microprocessor's execution of the device operations.

25. The energy device of claim 1, where the data comprises security data.

26. An energy device for monitoring electrical energy delivered through an electric circuit, the energy device comprising:
    a sensor configured to sense an operating characteristic of the electric circuit and generate digital samples indicative of the operating characteristic;
    a memory coupled to the sensor, the memory comprising a portion of high density, non-volatile memory operative to store data when no electrical power is supplied to the memory, the memory having an endurance of at least 1,000,000,000 erase events, and the memory being configured to store data, wherein the memory is further operative to store operating data and is ready to provide device operations to at least one microprocessor as soon as power is applied to the energy device;
    at least one data interface; and the microprocessor coupled to the memory and to the data interface, the microprocessor configured to provide the data from the memory to the data interface;

wherein the microprocessor is operative to use user-programmable instructions stored in the memory.

27. The energy device of claim 26, wherein the sensor comprises an analog sensor configured to generate an analog signal indicative of the operating characteristic; and, an analog to digital converter coupled with the sensor and operative to convert the analog signal to one or more digital samples.

28. The energy device of claim 26, wherein the sensor comprises a digital sensor configured to directly generate one or more digital samples indicative of the operating characteristic.

29. The energy device of claim 26, wherein the operating characteristic is the voltage of the electric circuit.

30. The energy device of claim 26, wherein the energy device is a revenue meter and at least a portion of the data stored in the memory is indicative of energy supplied to a consumer site.

31. The energy device of claim 26, wherein the energy device is a relay.

32. The energy device of claim 26, wherein the energy device is a power quality device.

33. The energy device of claim 26, wherein the data comprises digital samples.

34. The energy device of claim 26, wherein the data comprises setup data.

35. The energy device of claim 26, wherein the non-volatile memory comprises non-destructive read out ferroelectric random access memory.

36. The energy device of claim 26, wherein the non-volatile memory comprises polymeric ferroelectric random access memory.

37. The energy device of claim 26, wherein the non-volatile memory comprises magnetoresistive random access memory.

38. The energy device of claim 26, wherein the non-volatile memory comprises organic random access memory.

39. The energy device of claim 26, wherein the non-volatile memory comprises chalcogenide random access memory.

40. The energy device of claim 26, wherein the non-volatile memory comprises holographic random access memory.

41. The energy device of claim 26, wherein the non-volatile memory comprises phase-state low-electron drive memory.

42. The energy device of claim 26, wherein the non-volatile memory comprises single-electron random access memory.

43. An energy device for monitoring electrical energy delivered through an electric circuit, the energy device comprising:

a sensor configured to sense an operating characteristic of the electric circuit and generate digital samples through an analog to digital converter indicative of the operating characteristic;

an organic random access memory coupled to the analog to digital converter, the organic random access memory being configured to store data in response to the digital samples, wherein the memory is operative to store operating data and is ready to provide device operations to at least one microprocessor as soon as power is applied to the energy device;

at least one data interface coupled with the sensor; and the microprocessor coupled to the memory and to the data interface, the microprocessor configured to provide the data from the memory to the data interface;

wherein the microprocessor is operative to use user-programmable instructions stored in the memory to implement input/output control.

44. The energy device of claim 43, wherein the sensor comprises an analog sensor configured to generate an analog signal indicative of the operating characteristic; and, an analog to digital converter coupled with the sensor and operative to convert the analog signal to one or more digital samples.

45. The energy device of claim 43, wherein the operating characteristic is the voltage of the electric circuit.

46. An Intelligent Electronic Device ("IED") for measuring the delivery of electrical energy from an energy supplier through an electric circuit, the IED comprising:

a sensor configured to sense an operating characteristic of the electric circuit and generate digital samples indicative of the operating characteristic;

a memory coupled to the sensor, the memory including at least one memory device comprising at least 1 megabytes of non-volatile, solid state storage operative to store data when no electrical power is supplied to the memory, the memory having an endurance of at least 1,000,000,000 erase events and operative to store said digital samples for at least one year, and at least a portion of the memory being configured to store data in the form of logs in response to the digital samples wherein the memory is further operative to store operating data and is ready to provide device operations to a microprocessor as soon as power is applied to the IED;

at least one data interface; and the microprocessor coupled to the memory and to the data interface, the microprocessor configured to provide the data from the memory to the data interface;

wherein the microprocessor is operative to store information on a power quality event in the memory.

47. The IED of claim 46, wherein the sensor comprises an analog sensor configured to generate an analog signal indicative of the operating characteristic; and, an analog to digital converter coupled with the sensor and operative to convert the analog signal to one or more digital samples.

48. The IED of claim 46, wherein the sensor comprises a digital sensor configured to directly generate one or more digital samples indicative of the operating characteristic.

49. The IED of claim 46, wherein at least a portion of the solid state storage is high density memory.

50. The IED of claim 46, wherein at least a portion of the solid state storage is removable.

51. The IED of claim 46, wherein the capacity of the solid state storage includes at least sixty four megabytes of data sample memory.

52. The IED of claim 46, wherein the capacity of the memory includes at least one gigabyte of data sample memory.

53. The IED of claim 46, wherein a portion of the memory is removable.

54. The IED of claim 46, wherein the operating characteristic is the voltage of the electric circuit.

55. The IED of claim 46, wherein the operating characteristic is indicative of power delivered through the electric circuit.

56. The IED of claim 46, wherein the IED is a revenue meter and the data stored in the memory is indicative of energy supplied to a consumer site.

57. The IED of claim 46, wherein the IED is a relay.

58. The IED of claim 46, wherein the data comprises digital samples.

59. The IED of claim 46, wherein the data comprises setup data.

60. The IED of claim 46, wherein at least a portion of the memory comprises at least one memory type selected from the group comprising holographic storage and fractal cluster glass memory.

61. The IED of claim 46, further wherein the solid state memory comprises at least one memory type selected from the group comprising polymeric ferroelectric random access memory, polymer random access memory, and non destructive read out ferroelectric random access memory.

62. The IED of claim 46, further wherein the solid state memory comprises at least one memory type selected from the group comprising magnetoresistive random access memory, fractal cluster glass random access memory, chalcogenide random access memory, holographic random access memory, phase-state low-electron drive memory (PLEDM), and single-electron-memory.

63. An Intelligent Electronic Device ("IED") for measuring the delivery of electrical energy from an energy supplier through an electric circuit, the IED comprising:
a sensor configured to sense an operating characteristic of the electric circuit and generate digital samples indicative of the operating characteristic;
a non-volatile solid-state memory coupled to the sensor, the memory having an endurance of at least 1,000,000,000 erase events;
at least one data interface; and
a microprocessor coupled to the memory and to the data interface, the microprocessor configured to provide the data from the memory to the data interface;
wherein a portion of the memory is removable and operative to store digital samples for at least one year, wherein said memory is further operative to store operating data and is ready to provide device operations to the microprocessor as soon as power is applied to the IED.

64. An energy device for monitoring electrical energy delivered through an electric circuit, the energy device comprising:
a sensor configured to sense an operating characteristic of the electric circuit and generate digital samples indicative of the operating characteristic;
a non-volatile solid-state memory coupled to the sensor, the memory having an endurance of at least 1,000,000.000 erase events;
at least one data interface; and
at least one microprocessor coupled to the memory and to the data interface, the microprocessor configured to provide the data from the memory to the data interface;
wherein the microprocessor is operative to use user-programmable instructions stored in the memory;
wherein the memory is operative to store operating data, the memory is ready to provide device operations to the microprocessor as soon as power is applied to the energy device.

65. The energy device of claim 64, wherein at least a portion of the solid state memory is removable.

66. The energy device of claim 64, wherein the user-programmable instructions stored in the memory implement input/output control for the energy device.

67. The energy device of claim 64, wherein the user-programmable instructions stored in the memory implement communication and data file manipulation functions for the energy device.

68. The energy device of claim 64, wherein the user-programmable instructions stored in the memory implement power management control functions for the energy device.

69. The energy device of claim 64, wherein the operating characteristic is indicative of current delivered through the electric circuit.

70. The energy device of claim 64, wherein the microprocessor is operative to store information on a power quality event in the memory.

71. The energy device of claim 70, wherein the power quality event comprises a blackout.

72. The energy device of claim 70, wherein the power quality event comprises a brownout.

73. The energy device of claim 70, wherein the power quality event comprises a surge.

74. The energy device of claim 70, wherein the power quality event comprises a harmonic distortion.

75. The energy device of claim 70, wherein the power quality event comprises an overvoltage.

76. The energy device of claim 70, wherein the power quality event comprises an imbalance.

* * * * *